(12) United States Patent
Noda

(10) Patent No.: US 7,414,903 B2
(45) Date of Patent: Aug. 19, 2008

(54) NONVOLATILE MEMORY DEVICE WITH TEST MECHANISM

(75) Inventor: Kenji Noda, Fukuoka (JP)

(73) Assignee: Nscore Inc., Fukuoka (JP)

( * ) Notice: Subject to any disclaimer, the term of this patent is extended or adjusted under 35 U.S.C. 154(b) by 158 days.

(21) Appl. No.: 11/413,987

(22) Filed: Apr. 28, 2006

(65) Prior Publication Data

US 2007/0253263 A1    Nov. 1, 2007

(51) Int. Cl.
*G11C 29/00*    (2006.01)
(52) U.S. Cl. ................................ 365/201; 365/154
(58) Field of Classification Search ................ 365/201, 365/154, 185.07
See application file for complete search history.

(56) References Cited

U.S. PATENT DOCUMENTS

| | | | | |
|---|---|---|---|---|
| 3,636,530 A | 1/1972 | Mark et al. | ................. | 365/228 |
| 4,419,744 A | 12/1983 | Rutter | ........................ | 365/145 |
| 5,764,854 A | 6/1998 | Archibald | | |
| 5,956,269 A | 9/1999 | Ouyang et al. | ......... | 365/185.08 |
| 6,469,930 B1 * | 10/2002 | Murray | ................. | 365/185.08 |
| 6,707,702 B1 * | 3/2004 | Komatsuzaki | ............... | 365/145 |
| 6,906,953 B2 | 6/2005 | Forbes et al. | ........... | 365/185.03 |
| 6,906,962 B2 | 6/2005 | Layman et al. | ......... | 365/189.01 |
| 6,909,635 B2 | 6/2005 | Forbes et al. | ................ | 365/174 |
| 7,149,104 B1 * | 12/2006 | Horiuchi | .................... | 365/154 |
| 2005/0232009 A1 | 10/2005 | Nakamura | ............ | 365/185.08 |

FOREIGN PATENT DOCUMENTS

JP    06-076582    3/1994

* cited by examiner

*Primary Examiner*—Anh Phung
(74) *Attorney, Agent, or Firm*—Ladas & Parry, LLP

(57) ABSTRACT

A nonvolatile semiconductor memory device includes a memory cell having a MIS transistor configured to experience an irreversible change in transistor characteristics thereof to store data as the irreversible change, the MIS transistor having a gate node coupled to a word selecting line and a source/drain node coupled to a bit line, and the MIS transistor becoming conductive in response to a first state of the word selecting line and becoming nonconductive in response to a second state of the word selecting line, and a test circuit coupled to the bit line to sense a current running through the MIS transistor, the test circuit configured to indicate error in response to either a detection of presence of the current when the word selecting line is in the second state or a detection of absence of the current when the word selecting line is in the first state.

8 Claims, 18 Drawing Sheets

|  | WLW="0" | | WLW="1" | |
|---|---|---|---|---|
|  | NO ERROR | ERROR | NO ERROR | ERROR |
| TRn | ALL 0 | (0&1) OR ALL 1 | ALL 1 | (0&1) OR ALL 0 |
| TON | 1 | 0 | 0 | 0 OR 1 |
| TOFF | 1 | 1 OR 0 | 0 | 1 |
| FAIL | 0 | 1 | 0 | 1 |

FIG.18

|  | WLW="0" | | WLW="1" | |
|---|---|---|---|---|
|  | NO ERROR | ERROR | NO ERROR | ERROR |
| TRNn | ALL 0 | (0&1) OR ALL 1 | ALL 1 | (0&1) OR ALL 0 |
| TRPn | ALL 0 | ALL 0 | ALL 0 | ALL 0 |
| TRn | ALL 0 | (0&1) OR ALL 1 | ALL 1 | (0&1) OR ALL 0 |
| TON | 1 | 0 | 0 | 0 OR 1 |
| TOFF | 1 | 1 OR 0 | 0 | 1 |
| FAIL | 0 | 1 | 0 | 1 |

FIG.20

|  | EQ="1" | | EQ="0" | |
| --- | --- | --- | --- | --- |
|  | NO ERROR | ERROR | NO ERROR | ERROR |
| TRNn | ALL 0 | ALL 0 | ALL 0 | ALL 0 |
| TRPn | ALL 0 | (0&1) OR ALL 1 | ALL 1 | (0&1) OR ALL 0 |
| TRn | ALL 0 | (0&1) OR ALL 1 | ALL 1 | (0&1) OR ALL 0 |
| TON | 1 | 0 | 0 | 0 OR 1 |
| TOFF | 1 | 1 OR 0 | 0 | 1 |
| FAIL | 0 | 1 | 0 | 1 |

NONVOLATILE MEMORY DEVICE WITH TEST MECHANISM

BACKGROUND OF THE INVENTION

1. Field of the Invention

The present invention generally relates to a memory device, and particularly relates to a nonvolatile memory device which is capable of retaining stored data in the absence of a power supply voltage.

2. Description of the Related Art

Nonvolatile semiconductor memory devices, which can retain stored data even when power is turned off, include flash EEPROMs employing a floating gate structure, FeRAMs employing a ferroelectric film, MRAMs employing a ferro-magnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/016143, which was filed on Dec. 17, 2003, the entire contents of which are hereby incorporated by reference, discloses a nonvolatile memory cell (i.e., a basic unit of data storage) comprised of a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience an irreversible hot-carrier effect on purpose for storage of one-bit data.

The hot-carrier effect leaves an irreversible lingering change in the transistor characteristics such as the threshold or on-resistance of the transistors. Changes in the characteristics of the MIS transistors caused by the hot-carrier effect achieve nonvolatile data retention. Which one of the MIS transistors has a stronger lingering change determines whether the stored data is "0" or "1".

A latch (flip-flop) circuit may be used together with the pair of MIS transistors for the purpose of reading (sensing) the data stored in the pair of MIS transistors. Such latch circuit may also be used to determine data to be stored in the memory-cell MIS transistors. That is, data to be stored as nonvolatile data may be first set in the latch circuit, and, then, the data stored in the latch circuit may subsequently be stored in the pair of MIS transistors. The latch circuit and the memory-cell MIS transistors together constitute a memory cell (memory circuit).

When a nonvolatile memory device having the nonvolatile memory cells as described above is manufactured, there is a need to conduct a test to ensure that the memory cells perform properly as designed. The latch circuit portion of each memory cell may properly be tested by use of a conventional SRAM test. The nonvolatile memory portion (comprised of a pair of memory-cell MIS transistors) of each memory cell, however, cannot be tested by use of a conventional test technique. This is because the operation of the nonvolatile memory portion is founded on an irreversible change of the transistor characteristics. If a test that creates such an irreversible change is actually performed, the memory circuit may no longer be usable.

Accordingly, there is a need for a nonvolatile memory device provided with a test mechanism that can test the operation of the memory cells without undermining the function of the memory cells where the memory cells include MIS transistors that are designed to experience an irreversible change in their characteristics for the purpose of nonvolatile data retention.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a nonvolatile memory device provided with a test mechanism that can test the operation of the memory cells without undermining the function of the memory cells where the memory cells include MIS transistors that are designed to experience an irreversible change in their characteristics for the purpose of nonvolatile data retention.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semi-conductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, which includes bit lines, word selecting lines, a plurality of memory cells arranged in a matrix, one of the memory cells including a MIS transistor configured to experience an irreversible change in transistor characteristics thereof to store data as the irreversible change, the MIS transistor having a gate node thereof coupled to one of the word selecting lines and a source/drain node thereof coupled to one of the bit lines, and the MIS transistor becoming conductive in response to a first state of the one of the word selecting lines and becoming nonconductive in response to a second state of the one of the word selecting lines, and a test circuit coupled to the one of the bit lines to sense a current running through the MIS transistor, the test circuit configured to indicate error in response to either a detection of presence of the current when the one of the word selecting lines is in the second state or a detection of absence of the current when the one of the word selecting lines is in the first state.

According to at least one embodiment of the present invention, the nonvolatile semiconductor memory device as described above is provided with the test circuit, which tests the conductivity of the MIS transistor by detecting a current flowing through the relevant bit line while the conductivity of the MIS transistor is switched between a conductive state and a nonconductive state. With this provision, it is possible to check the presence/absence of a current running through the MIS transistor designed to experience an irreversible change for nonvolatile data retention. Based on this check, a determination can be made as to whether this MIS transistor properly operates as a transistor and also as to whether circuit connections are properly formed by the manufacturing process.

Further, according to another aspect of the present invention, a method of testing a nonvolatile semiconductor memory device, which includes bit lines and a plurality of memory cells arranged in a matrix, one of the memory cells including a MIS transistor configured to experience an irreversible change in transistor characteristics thereof to store data as the irreversible change, the MIS transistor having a source/drain node thereof coupled to one of the bit lines, includes the steps of placing the MIS transistor in a selected one of a conductive state and a nonconductive state, and checking a current flowing through the one of the bit lines to check a current flowing through the MIS transistor.

BRIEF DESCRIPTION OF THE DRAWINGS

Other objects and further features of the present invention will be apparent from the following detailed description when read in conjunction with the accompanying drawings, in which:

FIG. 18 is a table chart showing logic values of some of the relevant signals for NMOS test operation;

FIG. 20 is a table chart showing logic values of some of the relevant signals for PMOS test operation.

DESCRIPTION OF THE PREFERRED EMBODIMENTS

In the following, embodiments of the present invention will be described with reference to the accompanying drawings.

Figure 1:
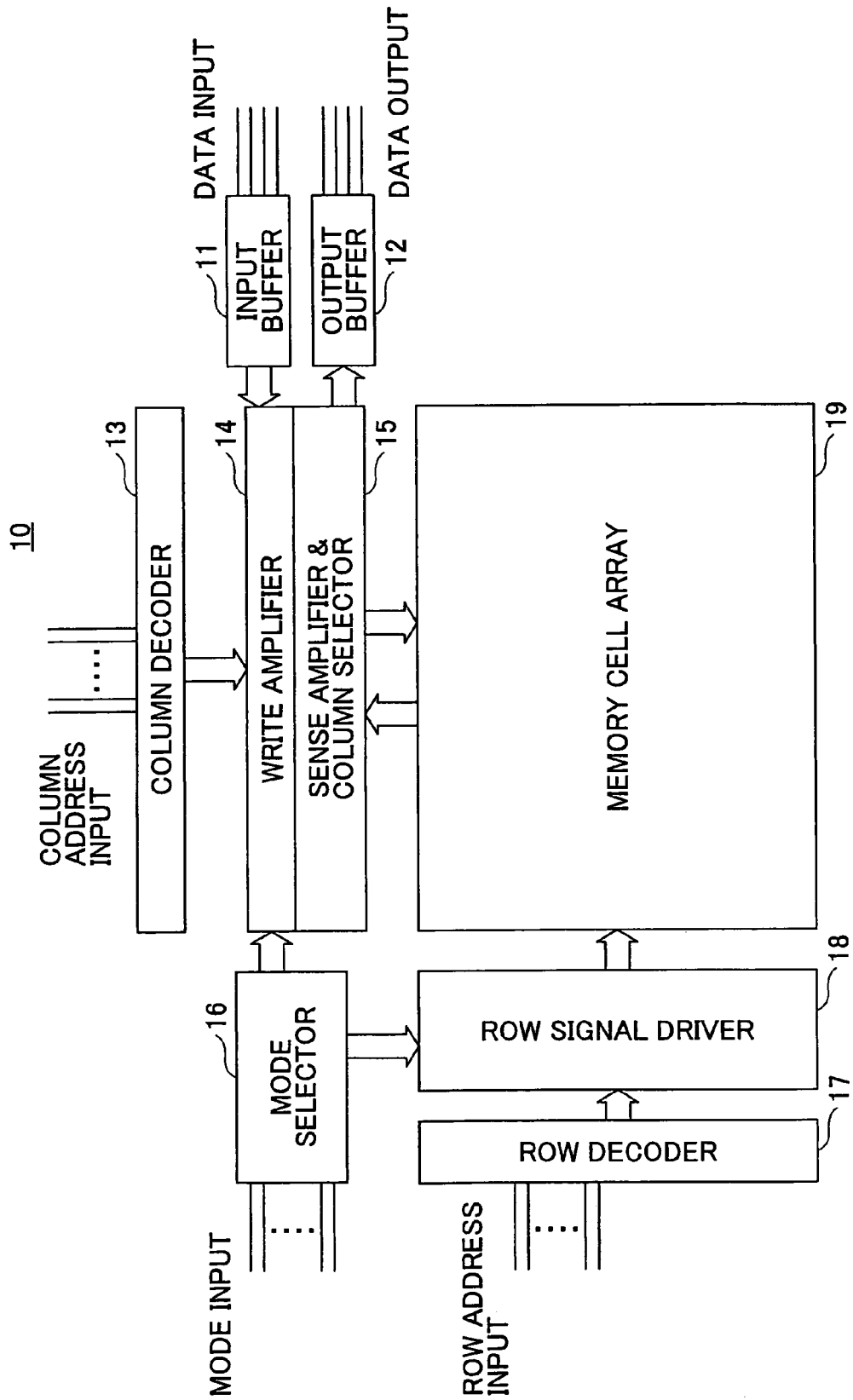
FIG. 1 is a block diagram showing the configuration of a nonvolatile semiconductor memory device in which a test mechanism of the present invention is incorporated.

FIG. 1 is a block diagram showing the configuration of a nonvolatile semiconductor memory device in which a test mechanism of the present invention is incorporated. A semiconductor memory device 10 shown in FIG. 1 includes an input buffer 11, an output buffer 12, a column decoder 13, a write amplifier 14, a sense amplifier & column selector 15, a mode selector 16, a row decoder 17, a row signal driver 18, and a memory-cell array 19.

The memory cell array 19 includes a plurality of memory cells arranged in a matrix form, each memory cell having a circuit configuration as will later be described. The memory cells arranged in the same column are connected to the same bit lines, and the memory cells arranged in the same row are connected to the same word line.

The mode selector 16 receives mode input signals from an exterior of the device, and decodes the mode input signal to determine an operation mode (e.g., a write operation mode, a read operation mode, or a test operation mode). Control signals responsive to the determined operation mode are supplied to the write amplifier 14, the sense amplifier & column selector 15, the row signal driver 18, etc., for control of the individual parts of the semiconductor memory device 10.

The column decoder 13 receives a column address input from the exterior of the device, and decodes the column address input to determine a selected column. The decode signals indicative of the selected column are supplied to the write amplifier 14 and the sense amplifier & column selector 15.

The row decoder 17 receives a row address input from the exterior of the device, and decodes the row address input to determine a selected row. The decode signals indicative of the selected row are supplied to the row signal driver 18.

In response to the control signals from the mode selector 16 and the decode signals from the row decoder 17, the row signal driver 18 activates a selected word line among the word lines extending from the row signal driver 18. As a result of the activation of the selected word line, a volatile memory unit of each memory cell corresponding to the selected word line is coupled to a corresponding bit line pair among a plurality of bit line pairs. Through this coupling, the writing/reading of data to/from the volatile memory portion of each memory cell is performed.

In response to the control signals from the mode selector 16 and the decode signals from the column decoder 13, the sense amplifier & column selector 15 couples the bit lines corresponding to the selected column to a data bus. Through this coupling, data is transferred between the memory cell array 19 and the data bus. The sense amplifier & column selector 15 amplifies the data read from the memory cell array 19 for provision to the output buffer 12. The data is output from the output buffer 12 to the exterior of the device as output data. Input data supplied to the input buffer 11 is provided to the write amplifier 14. The write amplifier 14 amplifies the input data to be written to the memory cell array 19.

Figure 2:
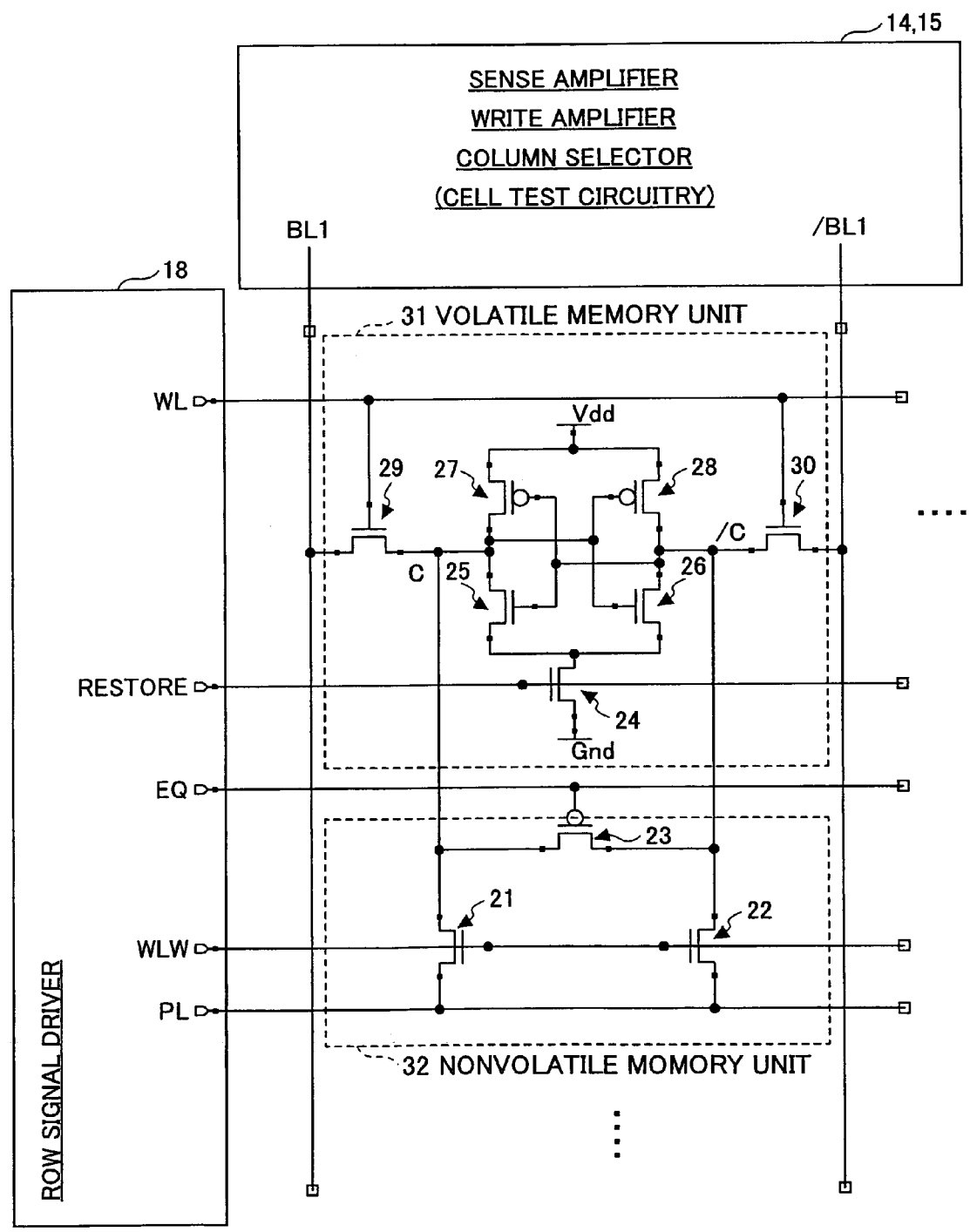
FIG. 2 is an illustrative drawing showing the configuration of a memory cell of the nonvolatile memory device shown in FIG. 1.

FIG. 2 is an illustrative drawing showing the configuration of a memory cell of the nonvolatile memory device shown in FIG. 1.

The memory cell includes NMOS transistors 21 and 22, a PMOS transistor 23, NMOS transistors 24 through 26, PMOS transistors 27 and 28, and NMOS transistors 29 and 30. The NMOS transistors 24 and 26 and PMOS transistors 27 and 28 together constitute a volatile memory unit (latch circuit) 31.

The NMOS transistors 21 and 22 constitute a nonvolatile memory unit 32.

The NMOS transistors 21 and 22 serving as nonvolatile memory cell transistors have the same structure as the other NMOS transistors including the NMOS transistors 24 through 26 used in the volatile memory unit and the NMOS transistors 29 and 30 used as a transfer gate between the memory cell and the bit lines.

As shown in FIG. 2, bit lines BL1 and /BL1 extend from the write amplifier 14 and the sense amplifier & column selector 15, and are coupled to the volatile memory unit 31 via the NMOS transistors 29 and 30 serving as a data transfer unit. A word selecting line WLW extends from the row signal driver 18, and is coupled to the gate nodes of the NMOS transistors 21 and 22 serving as the nonvolatile memory unit 30. A word line WL extends from the row signal driver 18 to be connected to the gates of the NMOS transistors 29 and 30. Further, a restore line RESTORE, plate line (controlled-power line) PL, and equalize line EQ also extend from the row signal driver 18.

It should be noted that the configuration shown in FIG. 2 is identical with respect to each and every one of the memory cells provided in the memory cell array 19. Namely, multiple sets of the lines RESTORE, PL, WLW, EQ, and WL are provided in one-to-one correspondence to the rows of the memory cell array 19.

Figure 3:
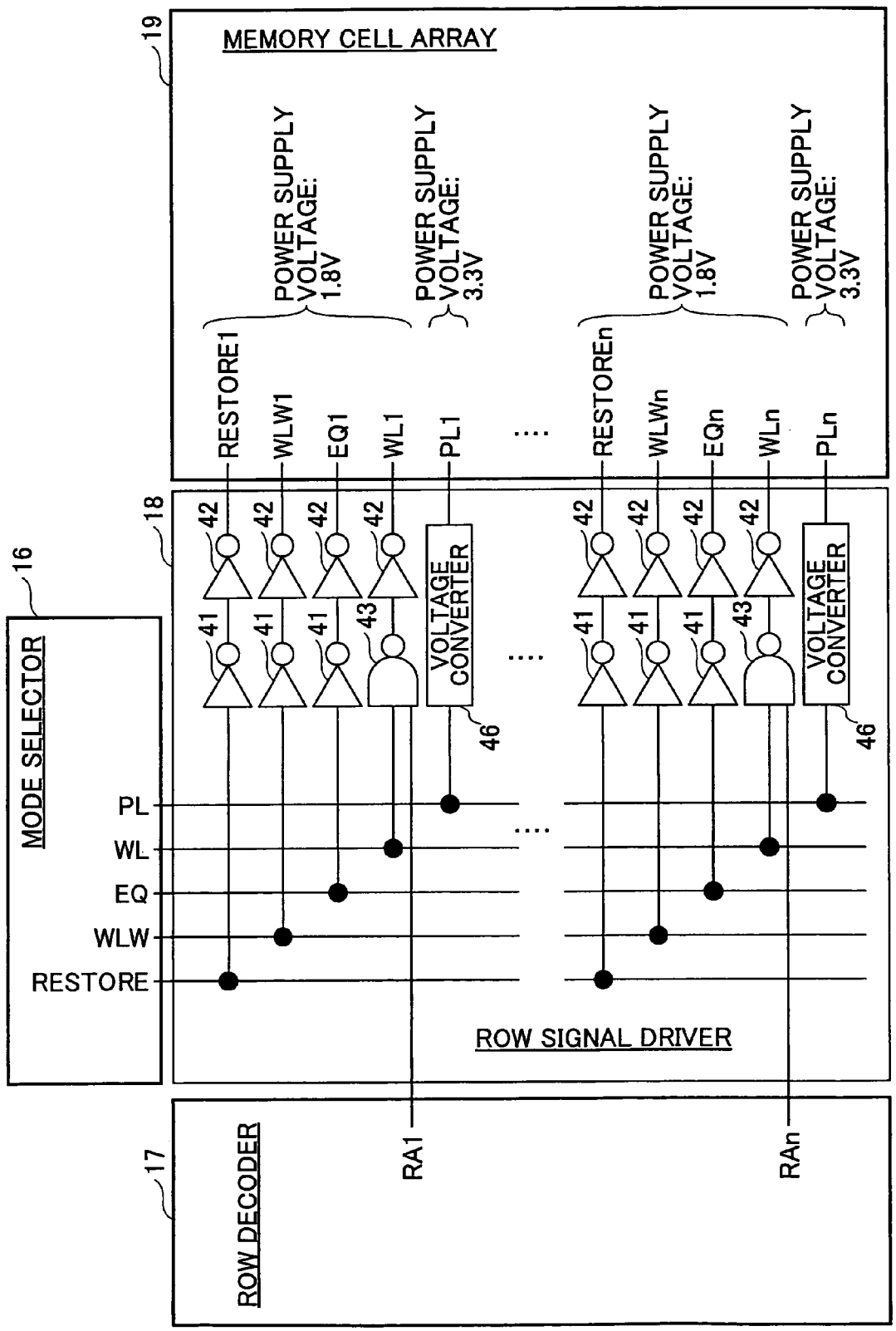
FIG. 3 is a drawing showing multiple sets of lines extending from a row signal driver and their relations with a mode selector and a row decoder.

FIG. 3 is a drawing showing the multiple sets of the lines extending from the row signal driver 18 and their relations with the mode selector 16 and the row decoder 17. In this configuration, store operation (storing data from the volatile memory unit 31 to the nonvolatile memory unit 32) and restore operation (reading data from the nonvolatile memory unit 32 to the volatile memory unit 31) are performed with respect to the entirety of the memory cell array 19, rather than performed on a row-address-specific basis. Read/write operations of the volatile memory unit 31 with respect to the bit lines BL1 and /BL1 are of course performed on a row-address-specific basis.

As shown in FIG. 3, the mode selector 16 supplies signals RESTORE, WLW, EQ, WL, and PL to the row signal driver 18. The signals RESTORE, WLW, EQ, and PL are coupled to the corresponding lines of each row without any logic operation, and are thus output from the row signal driver 18 to the memory cell array 19 as RESTORE1, WLW1, EQ1, and PL1 for a row address RA1 and RESTOREn, WLWn, EQn, and PLn for a row address RAn, for example. Inverters 41 and 42 are used as output buffers for RESTORE, WLW, and EQ. Voltage converters 46 are used for PL. The voltage converters 46 serve to covert the voltage of the signal PL to the voltage of the signal PLx (x=1, . . . , n).

The signal WL supplied from the mode selector 16 and each row address signal (RA1, . . . , RAn) supplied from the row decoder 17 are combined by a corresponding NAND gate 43, an output of which is inverted by the inverter 42 for provision to the memory cell array 19. Thus, only one of the signals WL1 through WLn is activated and supplied to the memory cell array 19 so as to activate a selected row address.

In this configuration, as described above, the store operation and restore operation are performed with respect to the entirety of the memory cell array 19. Alternatively, the store operation and restore operation may be performed separately for each row address. In such a case, the signals RESTORE, WLW, EQ, and PL supplied from the mode selector 16 are combined with each row address signal in the row signal driver 18 such as to achieve a proper row-address-specific store operation and restore operation.

Figure 4:
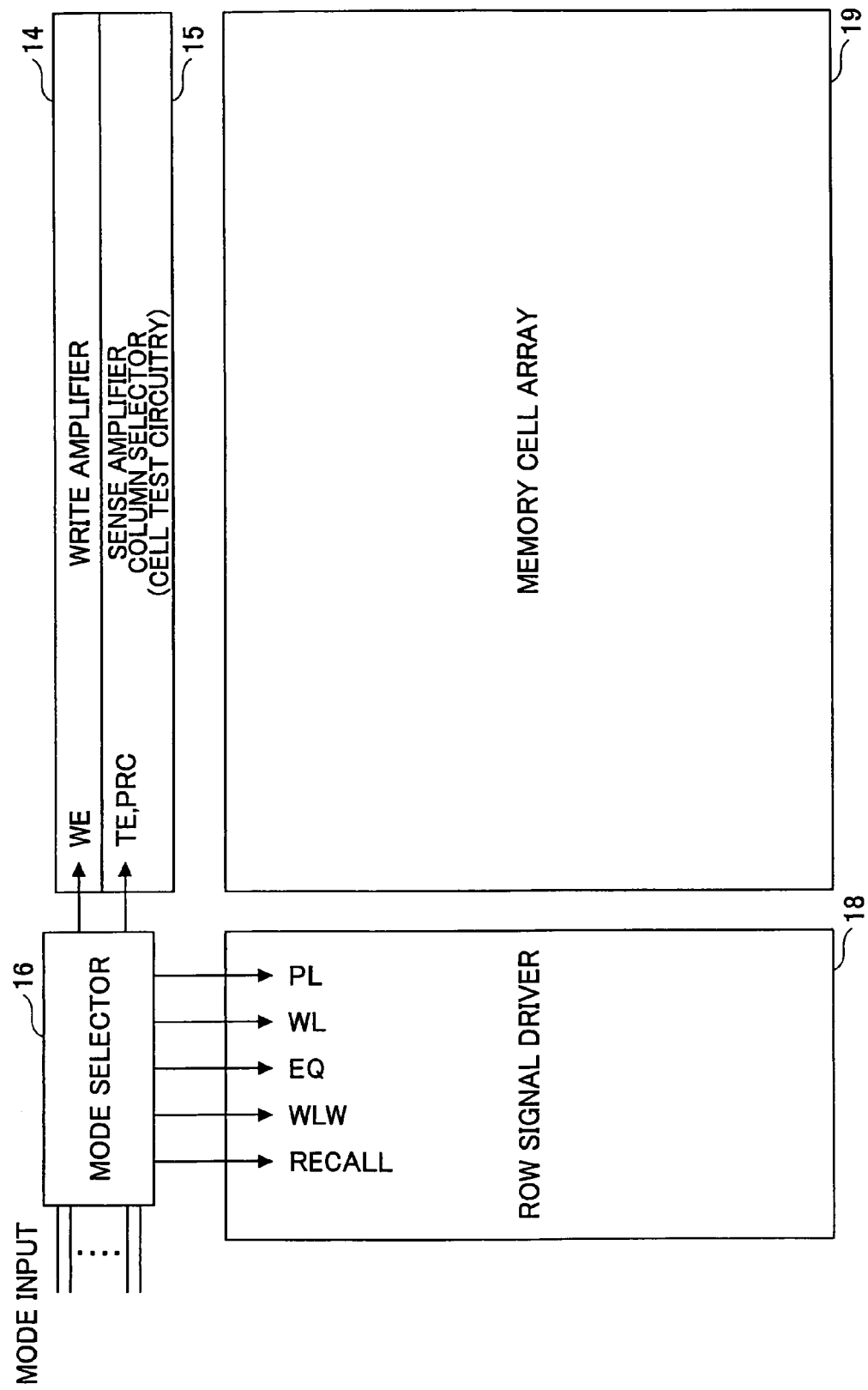
FIG. 4 is a drawing showing the flow of control signals output from the mode selector.

FIG. 4 is a drawing showing the flow of control signals output from the mode selector 16. As shown in FIG. 4, the mode selector 16 receives and decodes the mode input signals, and supplies various control signals to the row signal driver 18 and the write amplifier 14. Specifically, the control signals RESTORE, WLW, EQ, WL, and PL are supplied to the row signal driver 18, and a write enable signal WE is supplied to the write amplifier 14.

Further, a test enable signal TE and a precharge signal PRC are supplied from the mode selector 16 to a cell test circuitry, which is provided together with the sense amplifier & column selector 15. The mode selector 16 controls the test enable signal TE and the precharge signal PRC so as to cause the cell test circuitry to perform a test operation when the mode input signals indicate a test operation mode.

Turning to FIG. 2 again, the store operation of the nonvolatile memory device 10 will be briefly described. When the mode input from the exterior of the device indicates a store operation, the control signals PL, RESTORE, WLW, EQ, WL, and WE are set to 1, 1, 1, 0, 0, and 0, respectively. In response to PL being 1, the plate line PL is set to Vpp (=3.3 V), and in response to WLW being 1, the word selecting line WLW is set to Vpp/2.

The potentials of the node C and the node /C are inverse to each other, and the data stored in the latch circuit (NMOS transistors 25 and 26 and PMOS transistors 27 and 28) determines which one of the nodes C and /C is HIGH.

For the sake of convenience of explanation, it is assumed that the node /C is HIGH (Vdd=1.8 V), and the node C is LOW (GND: ground). In this case, only the NMOS transistor 21 experiences a rise in the threshold voltage due to a hot-carrier effect. The NMOS transistor 22 does not experience a change in the threshold voltage. This achieves the storing of the data of the volatile memory unit 31 in the nonvolatile memory unit 32.

During the store operation as described above, the high potential (3.3 V) is never applied to the latch circuit. This is because the NMOS transistors 21 and 22 serve as intervening circuit elements between the plate line PL (Vpp=3.3 V) and the nodes C and /C. Since the word selecting line WLW is set to Vpp/2, and the nodes C and /C are serving as source nodes, the potentials at the nodes C and /C cannot exceed Vpp/2 minus the threshold voltage. In this configuration, therefore, a hot-carrier effect does not happen in the transistors used in the latch circuit (volatile memory unit 31).

In the following, the restore operation of the nonvolatile memory device 10 will be briefly described. When the mode input from the exterior of the device indicates a restore operation, the control signals PL, RESTORE, WLW, EQ, WL, and WE are set to 0, 0-0-1, 0-1-0, 0-1-1, 0, and 0, respectively. Here, 0-1-0, for example, indicates that the signal level is set to 0 at the first phase, 1 at the second phase, and 0 at the third phase.

At the first phase, the signal RESTORE is set to 0, and the signal EQ is set to 0. As a result, the NMOS transistor 24 in FIG. 2 becomes nonconductive to deactivate the volatile memory unit 31, and the PMOS transistor 23 in FIG. 2 becomes conductive to equalize the nodes C and /C.

At the second phase, the signal EQ is set to 1, and the word selecting line WLW is set to 1. As a result, the PMOS transistor 23 is turned off to separate the nodes C and /C from each other, and the NMOS transistors 21 and 22 are turned on. Assuming that the store operation as described above has been performed prior to the restore operation, the NMOS transistor 21 has a higher threshold voltage, and thus has a higher ON resistance. Accordingly, the force that pulls down the node C is weaker than the force that pulls down the node /C, resulting in the nodes C and /C changing to HIGH and LOW, respectively.

At the third phase, the signal RESTORE is set to 1, and the word selecting line WLW is set to 0. As a result, the NMOS transistor 24 becomes conductive to activate the volatile memory unit 31, and the NMOS transistors 21 and 22 are turned off. The activated volatile memory unit 31 amplifies a potential difference appearing between the node C and the node /C, thereby sensing (detecting) the data stored in the nonvolatile memory unit 32.

In the configuration described above, a drain node and a source node of the NMOS transistors 21 and 22 used to apply a bias for generating the hot-carrier effect are swapped and used as a source node and a drain node, respectively, at the time of reading the data. With the swapping of the source and drain nodes at the time of data read operation relative to the time of data write operation, a change in the transistor characteristics caused by the hot-carrier effect is efficiently used as a means to store data.

It should be noted, however, that the storing and reading (restoring) of data can be performed without such swapping of source and drain nodes, as described in PCT/JP2003/016143, for example. The swapping of drain and source nodes merely serves to utilize asymmetry of a hot-carrier effect. Namely, when the source node and drain node used to apply a bias for generating a hot-carrier effect are swapped and used as a drain node and a source node, respectively, at the time of detecting a drain current, the detected drain current exhibits a larger drop caused by the hot-carrier effect than would be observed when no swapping was performed.

Figure 5:
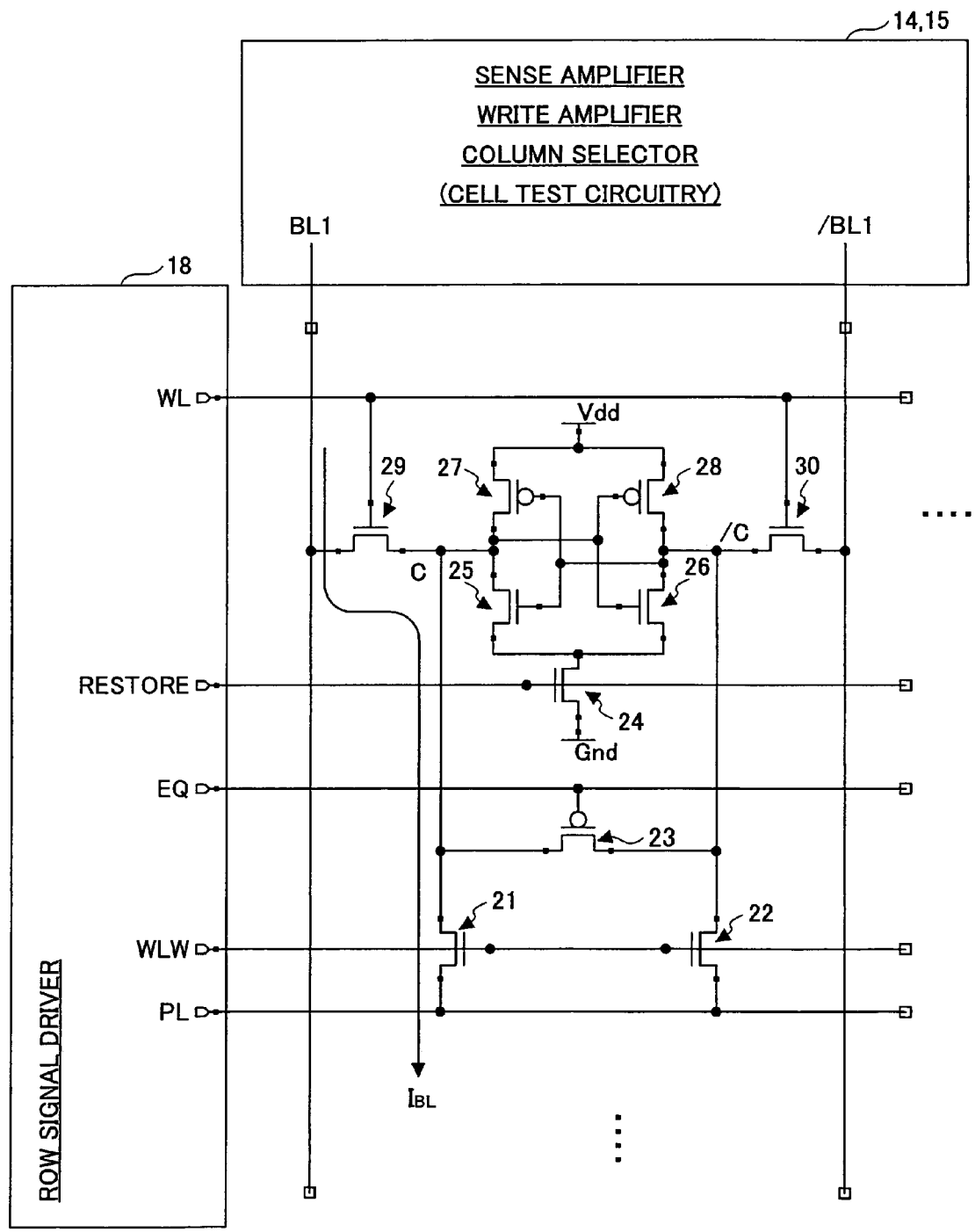
FIG. 5 is an illustrative drawing for explaining a test operation performed in the semiconductor memory device.

In the following, a first embodiment of a test mechanism provided in the semiconductor memory device 10 will be described. FIG. 5 is an illustrative drawing for explaining a test operation performed in the semiconductor memory device 10.

As shown in FIG. 5, in the test operation mode, a current $I_{BL}$ flowing through the NMOS transistor 21 is detected by the cell test circuitry which is provided together with the write amplifier & sense amplifier & column selector 14, 15. Please note that, in FIG. 5, the write amplifier 14 and the sense amplifier & column selector 15 (and the cell test circuitry) are put together and illustrated as a single unit. It should also be noted that, when the NMOS transistor 21 is to be tested, the word line WL is activated to turn on the NMOS transistor 29.

The current $I_{BL}$ is supposed to flow in sufficient amount when the NMOS transistor 21 is tuned on and thus conductive. The current $I_{BL}$ is supposed not to flow when the NMOS transistor 21 is tuned off and thus nonconductive. In this manner, the test operation mode of the present invention detects the presence/absence of a current running through a MIS transistor designed to experience a hot-carrier effect for nonvolatile data retention. Based on this detection, a check can be made as to whether this MIS transistor properly operates as a transistor and also as to whether circuit connections are properly formed by the manufacturing process.

The test operation as described above is performed with respect to each of the MIS transistors 21 and 22 of all the memory cells. The write amplifier & sense amplifier & column selector 14, 15, the cell test circuitry, and the row signal driver 18 are controlled by the mode selector 16 to perform such test operation.

Figure 6:
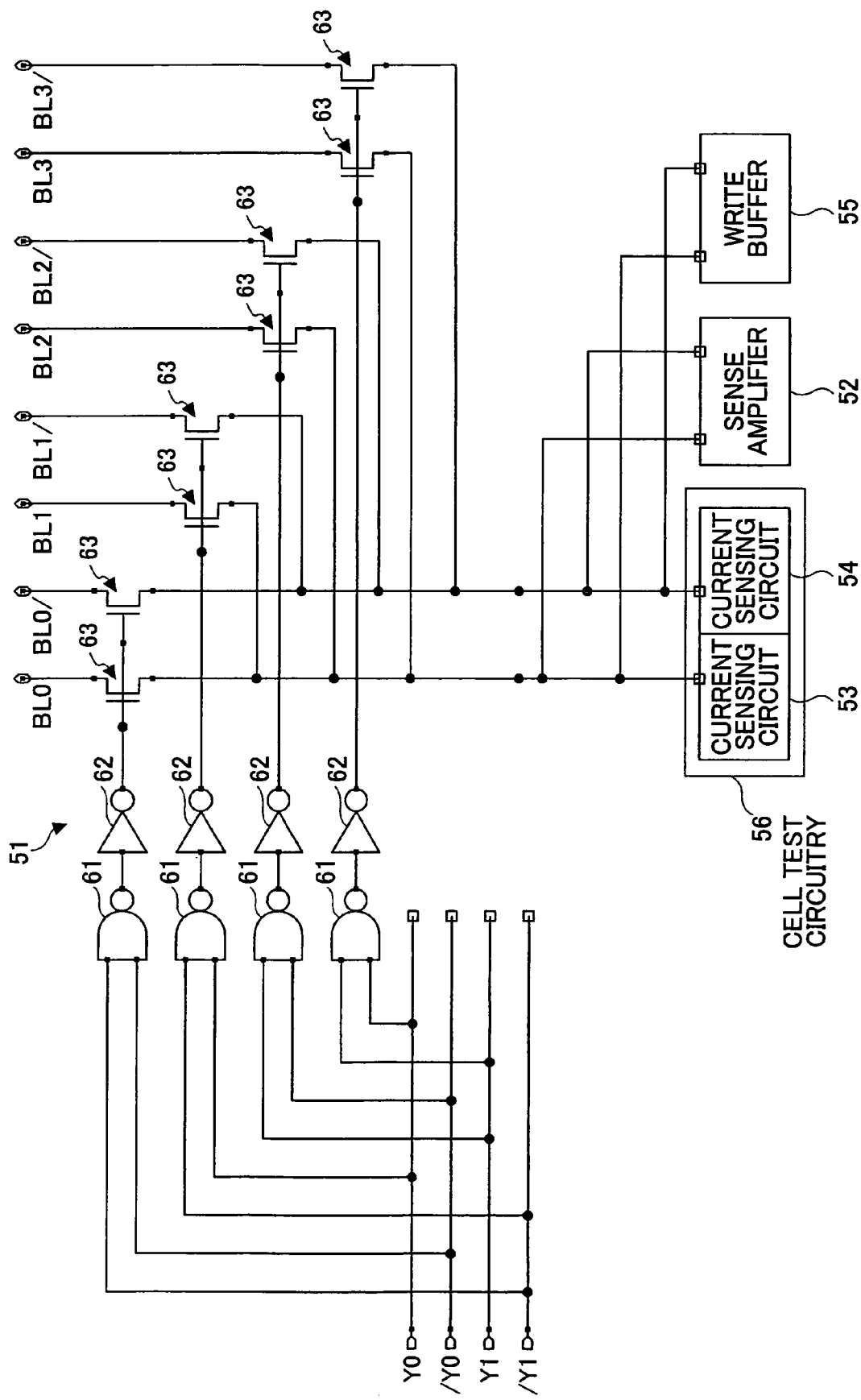
FIG. 6 is a drawing showing an example of the configuration of a write amplifier & sense amplifier & column selector provided together with a cell test circuitry.

FIG. 6 is a drawing showing an example of the configuration of the write amplifier & sense amplifier & column selector 14, 15 provided together with the cell test circuitry. As shown in FIG. 6, the write amplifier & sense amplifier & column selector 14, 15 include a column selector 51, a sense amplifier 52, and a write buffer 55, together with which a cell test circuitry 56 is provided. The cell test circuitry 56 includes a current sensing circuit 53 and a current sensing circuit 54. The column selector 51 includes NAND gates 61, inverters 62, and NMOS transistors 63.

The NAND gates 61 of the column selector 51 receive column address signals Y0, /Y0, Y1, and /Y1, and output decode results, thereby asserting (turning to LOW) only one of the NAND gate outputs corresponding to the selected column address. When one of the NAND gate outputs is asserted, the NMOS transistors 63 corresponding to the asserted output are turned on to become conductive, thereby coupling a corresponding pair of bit lines to the sense amplifier 52, the current sensing circuit 53, the current sensing circuit 54, and the write buffer 55.

The sense amplifier 52 is provided for the purpose of reading (sensing) the data appearing on the coupled bit lines. The write buffer 55 is provided for the purpose of writing (transmitting) write data to the coupled bit lines. The current sensing circuits 53 and 54 are provided for the purpose of detecting the current $I_{BL}$ as previously described.

With the configuration as described above, it is possible to suppress an increase in the circuit size caused by providing the current sensing circuits for the test purpose according to the present invention. In the configuration shown in FIG. 6, one of the four bit line pairs is selected and coupled to the current sensing circuits. This is only a non-limiting example, and the number of bit line pairs selected by the column selector 51 can be any number.

Figure 7:
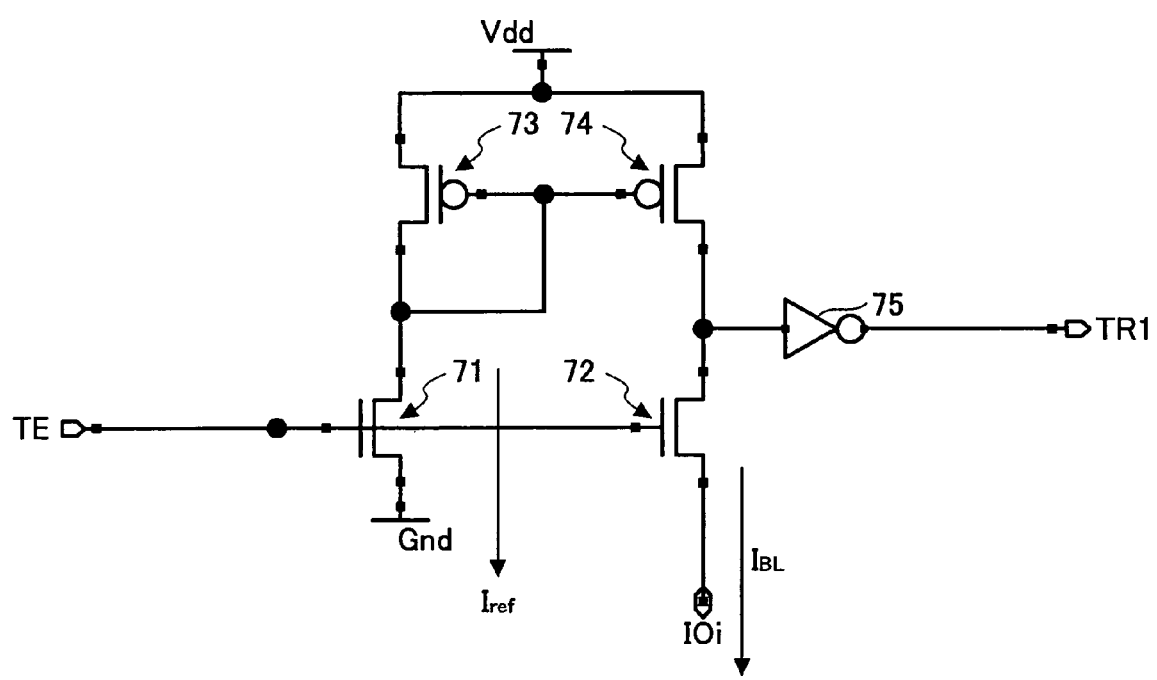
FIG. 7 is a circuit diagram showing an example of the configuration of a current sensing circuit.

FIG. 7 is a circuit diagram showing an example of the configuration of a current sensing circuit. Each of the current sensing circuits 53 and 54 shown in FIG. 6 may have the same circuit configuration shown in FIG. 7.

The current sensing circuit of FIG. 7 includes NMOS transistors 71 and 72, PMOS transistors 73 and 74, and an inverter 75. The PMOS transistors 73 and 74 have the same channel width and same channel length, and have the gate nodes thereof coupled to each other, thereby forming a current mirror circuit. A reference current $I_{ref}$ runs through the PMOS transistor 73 and the NMOS transistor 71, and the current $I_{BL}$ runs through the PMOS transistor 74 and the NMOS transistor 72. The current $I_{BL}$ is supplied to the NMOS transistor 21, for example, via the NMOS transistor 29 as shown in FIG. 5.

The NMOS transistors 71 and 72 have the gate node thereof to which the test enable signal TE is applied. When the test enable signal TE is set to HIGH, the NMOS transistors 71 and 72 are turned on to become conductive.

The NMOS transistors 71 and 72 are configured such that the channel width of the NMOS transistor 71 is much narrower than the channel width of the NMOS transistor 72, or the channel length of the NMOS transistor 71 is much longer than the channel length of the NMOS transistor 72. This makes it possible to set $I_{ref}$ to a threshold current amount that discriminates the presence/absence of the current $I_{BL}$. It should be noted that the channel width of the NMOS transistor 72 is preferably set wider than the channel width of the NMOS transistor 21.

If the current $I_{BL}$ is larger than the reference current $I_{ref}$, the input node of the inverter 75 is set to a low potential, resulting in the output TR1 of the inverter 75 being HIGH. If the current $I_{BL}$ is smaller than the reference current $I_{ref}$, the input node of the inverter 75 is set to a high potential, resulting in the output TR1 of the inverter 75 being LOW. In this manner, the current sensing circuit detects (senses) the current $I_{BL}$ flowing through an NMOS transistor serving as a nonvolatile memory cell transistor (i.e., the NMOS transistor 21 shown in FIG. 5).

The output TR1 of the inverter 75 serves as a test result signal for the corresponding NMOS transistor 21. In the following, a test result signal for the NMOS transistor paired with the NMOS transistor 21 (i.e., the NMOS transistor 22 shown in FIG. 5) is designated as /TR1. Further, test result signals for n NMOS transistors are designated as TR1, TR2, TR3, . . . , and TRn, and test result signals for the NMOS transistors paired with these n NMOS transistors are designated as /TR1, /TR2, /TR3, . . . , and /TRn.

Figure 8:
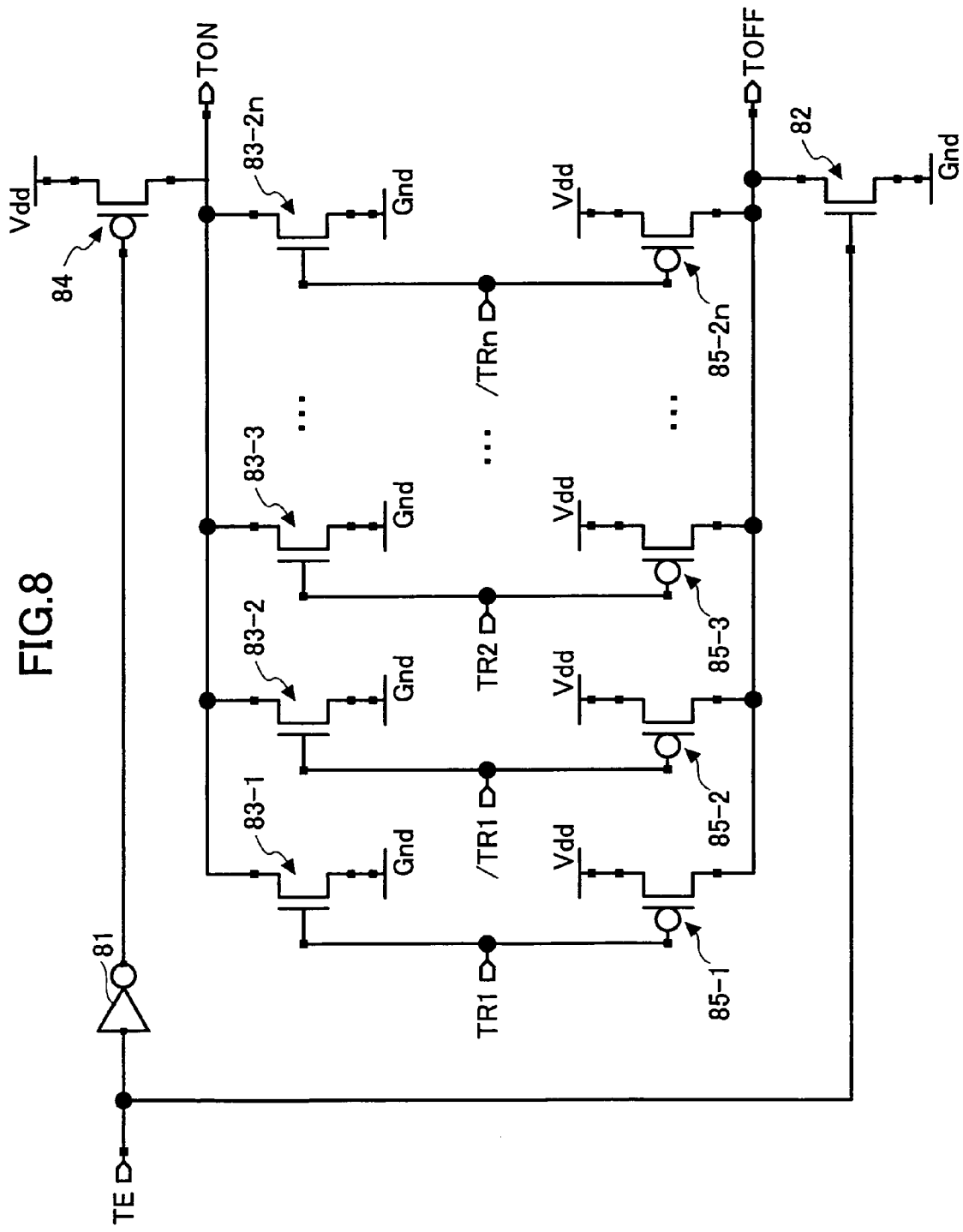
FIG. 8 is a circuit diagram showing part of the cell test circuitry.

FIG. 8 is a circuit diagram showing part of the cell test circuitry 56. The part of the cell test circuitry 56 shown in FIG. 8 includes an inverter 81, an NMOS transistor 82, NMOS transistors 83-1 through 83-2n, a PMOS transistor 84, and PMOS transistors 85-1 through 85-2n. Here, n is the number of memory cells (memory circuits) that are simultaneously tested by the cell test circuitry 56. Since each memory cell has two NMOS transistors 21 and 22 (see FIG. 5), there are 2n test result signals TR1, /TR1, TR2, /TR2, . . . , TRn, and /TRn. These test result signals TR1, /TR1, TR2, /TR2, . . . , TRn, and /TRn are applied to the gates of the NMOS transistors 83-1 through 83-2n, respectively, and are also applied to the gates of the PMOS transistors 85-1 through 85-2n, respectively.

The precharge signal PRC is supplied from the mode selector 16. When the precharge signal PRC becomes HIGH, the NMOS transistor 82 and the PMOS transistor 84 become conductive. The conductance of the NMOS transistor 82 and the PMOS transistor 84 is set much smaller than the conductance of the NMOS transistors 83-1 through 83-2n and the PMOS transistors 85-1 through 85-2n.

If at least one of the test result signals TR1, /TR1, TR2, /TR2, . . . , TRn, and /TRn is HIGH, TON is set to LOW (Gnd). Only when all the test result signals TR1, /TR1, TR2, /TR2, . . . , TRn, and /TRn are LOW, TON is set to HIGH (Vdd). If at least one of the test result signals TR1, /TR1, TR2, /TR2, . . . , TRn, and /TRn is LOW, TOFF is set to HIGH (Vdd). Only when all the test result signals TR1, /TR1, TR2, /TR2, . . . , TRn, and /TRn are HIGH, TON is set to LOW (Vdd).

Accordingly, both TON and TOFF become LOW if all the NMOS transistors tested for their operation properly allow respective currents to flow through (i.e., if TR1, /TR1, TR2, /TR2, . . . , TRn, and /TRn are all HIGH). Both TON and TOFF become HIGH if all the NMOS transistors tested for their operation properly prevent respective currents from flowing through (i.e., if TR1, /TR1, TR2, /TR2, . . . , TRn, and /TRn are all LOW).

Figure 9:
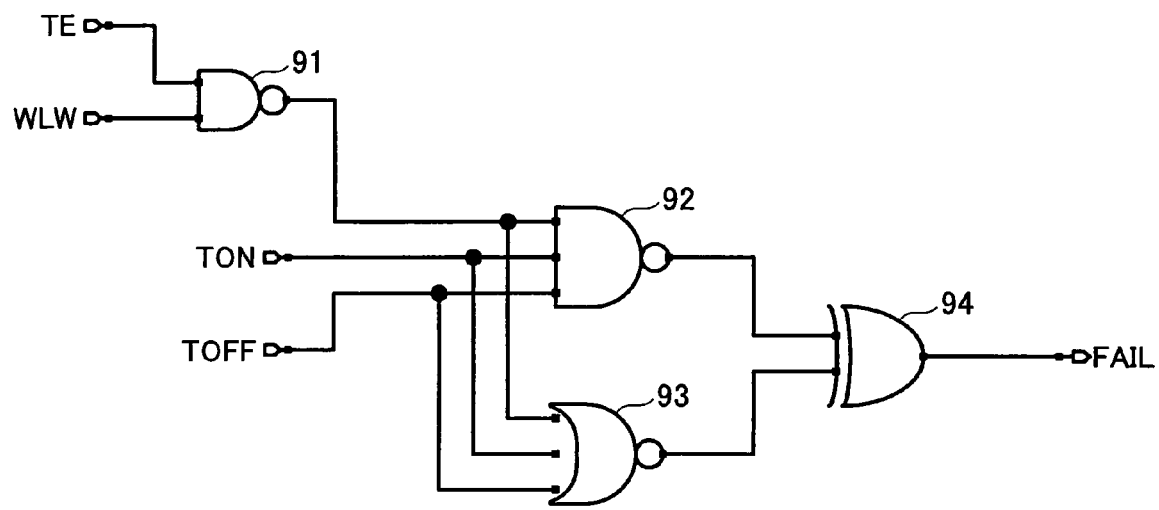
FIG. 9 is a circuit diagram showing another part of the cell test circuitry.

FIG. 9 is a circuit diagram showing another part of the cell test circuitry 56. The part of the cell test circuitry 56 shown in FIG. 9 includes a NAND gate 91, a NAND gate 92, a NOR gate 93, and an exclusive-OR gate 94. When the NMOS transistors to be tested are to be tested for their proper conductive state (i.e., currents properly flow through these NMOS transistors), the word selecting line WLW is set to HIGH (see FIG. 5).

When the test enable signal TE is HIGH and the word selecting line WLW is also HIGH, the NAND gate 91 produces a LOW output. This LOW output causes the output of the NAND gate 92 to be fixed to HIGH. Only if both TON and TOFF are set to LOW, indicating that all the NMOS transistors properly allow respective currents to flow through, does the NOR gate 93 produce a HIGH output, resulting in the output of the exclusive-OR gate 94 being LOW. Otherwise, the output of the exclusive-OR gate 94 is set to HIGH.

When the test enable signal TE is HIGH and the word selecting line WLW is LOW, the NAND gate 91 produces a HIGH output. This HIGH output causes the output of the NOR gate 93 to be fixed to LOW. Only if both TON and TOFF are set to HIGH, indicating that all the NMOS transistors properly prevent respective currents from flowing through, does the NAND gate 92 produce a LOW output, resulting in the output of the exclusive-OR gate 94 being LOW. Otherwise, the output of the exclusive-OR gate 94 is set to HIGH.

Accordingly, the output of the exclusive-OR gate 94 serves as a fail signal FAIL, which becomes LOW if the test results indicate no error, and becomes HIGH if any one of the test results indicates an error.

Figures 10, 11:
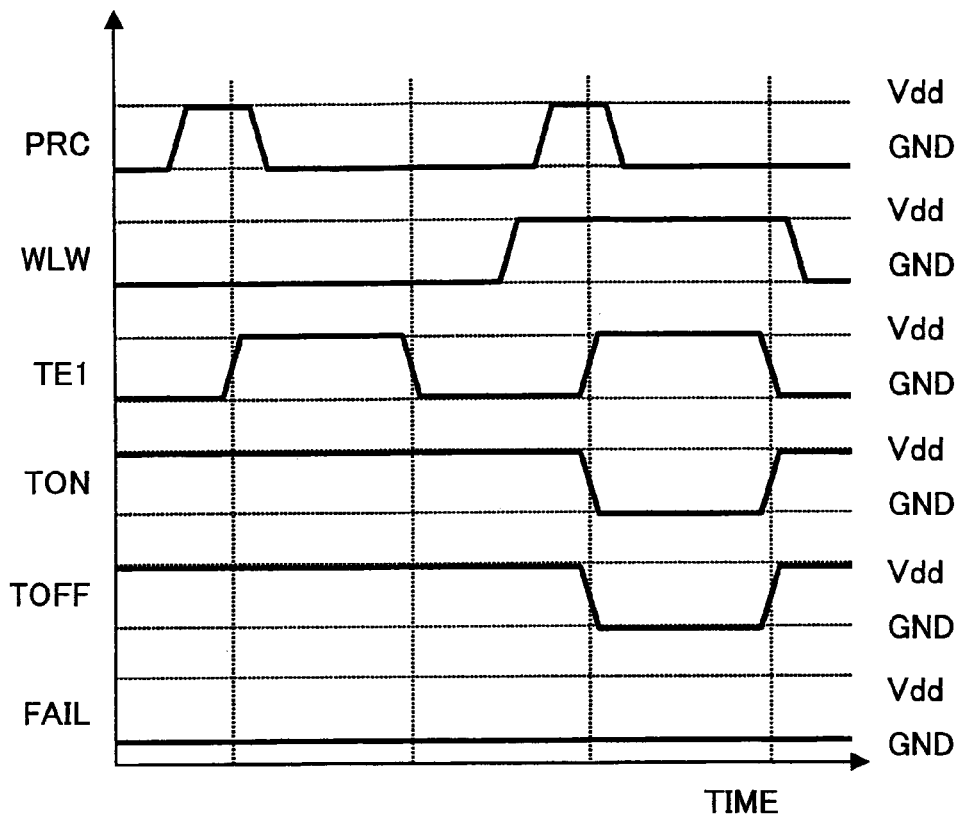
FIG. 10 is a signal waveform chart showing signal waveforms that are used when test operations are performed.
FIG. 11 is a table chart showing logic values of some of the relevant signals for test operation.

FIG. 10 is a signal waveform chart showing signal waveforms that are used when test operations are performed. As shown in FIG. 10, the word selecting line WLW is first set to LOW to check whether all the NMOS transistors to be tested are properly placed in a nonconductive state. The precharge signal PRC and the test enable signal TE are then set to HIGH to check the test results, resulting in TON and TOFF being both HIGH. The fact that both TON and TOFF are HIGH in this case indicates that none of the NMOS transistors exhibits an error. The fail signal FAIL is LOW in this case.

The word selecting line WLW is then set to HIGH to check whether all the NMOS transistors to be tested are properly placed in a conductive state. The precharge signal PRC and the test enable signal TE are then set to HIGH to check the test results, resulting in TON and TOFF being both LOW. The fact that both TON and TOFF are LOW in this case indicates that none of the NMOS transistors exhibits an error. The fail signal FAIL is LOW in this case.

FIG. 11 is a table chart showing logic values of some of the relevant signals for test operation. As shown in FIG. 11, when WLW is 0, the fact that TRn (TR1, /TR1, TR2, /TR2, . . . , TRn, and /TRn) are all zero indicates there is no error. If any one of TRn is 1, the fail signal FAIL becomes 1, indicating the presence of an error.

When WLW is 1, on the other hand, the fact that TRn (TR1, /TR1, TR2, /TR2, . . . , TRn, and /TRn) are all "1" indicates there is no error. If any one of TRn is zero, the fail signal FAIL becomes 1, indicating the presence of an error.

Figure 12:
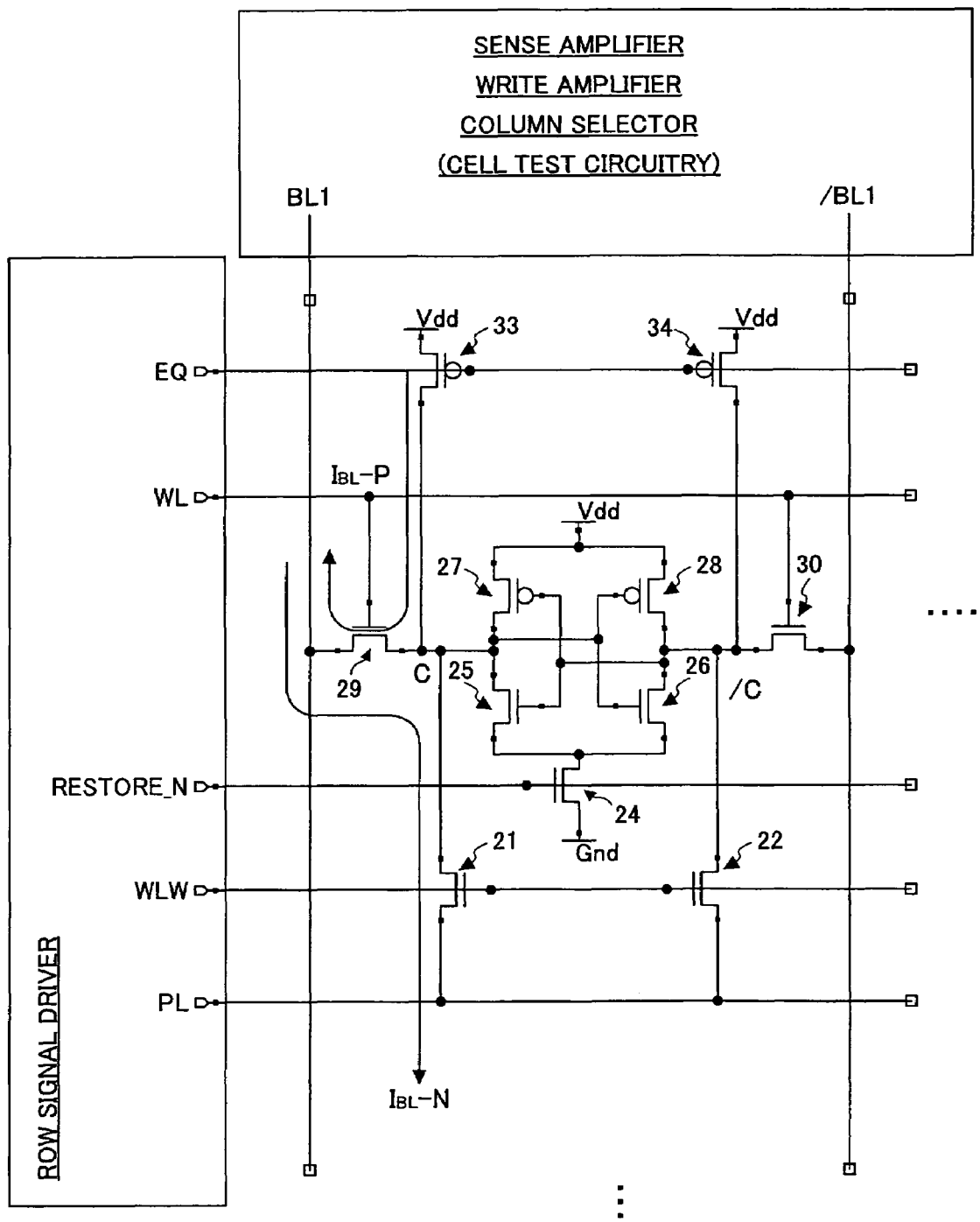
FIG. 12 is an illustrative drawing for explaining test operations performed in the semiconductor memory device.

In the following, a second embodiment of a test mechanism provided in the semiconductor memory device 10 will be described. FIG. 12 is an illustrative drawing for explaining test operations performed in the semiconductor memory device 10.

In the memory cell configuration as shown in FIG. 5, the PMOS transistor 23 is used for the purpose of equalizing the nodes C and /C. In this configuration, however, the PMOS transistor 23 cannot be tested with respect to its conductive state and nonconductive state. That is, the PMOS transistor 23 cannot be tested to see whether the PMOS transistor 23 properly becomes conductive or nonconductive.

In the memory cell configuration shown in FIG. 12, PMOS transistors 33 and 34 are provided in place of the PMOS transistor 23 shown in FIG. 5. Instead of using the PMOS transistor 23 to equalize the nodes C and /C, the PMOS transistors 33 and 34 are used to set the nodes C and /C to a predetermined potential. Namely, when the equalize line EQ is set to LOW, the PMOS transistors 33 and 34 become conductive so as to set the nodes C and /C to the power supply voltage Vdd.

In this configuration, the PMOS transistor 33 can be tested by checking a current IBL–P that passes through the PMOS transistor 33 and the NMOS transistor 29. It should be noted that the PMOS transistor 34 can be tested similarly.

The NMOS transistor 21 can be tested in the same manner as in the first embodiment shown in FIG. 5. Namely, in the test operation mode of the second embodiment, a current $I_{BL}$–N flowing through the NMOS transistor 21 is detected by the cell test circuitry provided together with the write amplifier & sense amplifier & column selector 14, 15.

The current $I_{BL}$-N flows out of the cell test circuitry provided together with the write amplifier & sense amplifier & column selector 14, 15. The current $I_{BL}$-P, on the other hand, flows into the cell test circuitry, so that different current sensing mechanisms may be required separately for the sensing of the current $I_{BL}$-N and for the sensing of the current $I_{BL}$-N.

The current $I_{BL}$-N is supposed to flow in sufficient amount when the NMOS transistor 21 is tuned on and thus conductive, and is supposed not to flow when the NMOS transistor 21 is tuned off and thus nonconductive. Further, the current $I_{BL}$-P is supposed to flow in sufficient amount when the PMOS transistor 33 is tuned on and thus conductive, and is supposed not to flow when the PMOS transistor 33 is tuned off and thus nonconductive. It should be noted that, when the NMOS transistor 21 or PMOS transistor 33 is to be tested, the word line WL is activated to turn on the NMOS transistor 29.

In this manner, the test operation mode of the second embodiment detects the presence/absence of a current running through a transistor to be tested. Based on this detection, a check can be made as to whether this transistor properly operates as a transistor and also as to whether circuit connections are properly formed by the manufacturing process.

The test operation as described above is performed with respect to each of the MIS transistors 21, 22, 33, and 34 of all the memory cells. The write amplifier & sense amplifier & column selector 14, 15, the cell test circuitry 56, and the row signal driver 18 are controlled by the mode selector 16 to perform such test operation.

The configuration of the write amplifier & sense amplifier & column selector 14, 15 and the cell test circuitry 56 may be the same as those used in the first embodiment. Namely, as shown in FIG. 6, the write amplifier & sense amplifier & column selector 14, 15 include the column selector 51, the sense amplifier 52, the write buffer 55, together with which the cell test circuitry 56 is provided. The cell test circuitry 56 includes the current sensing circuit 53 and the current sensing circuit 54. The operations of these circuits are basically the same as were previously described in connection with FIG. 6.

Figure 13:
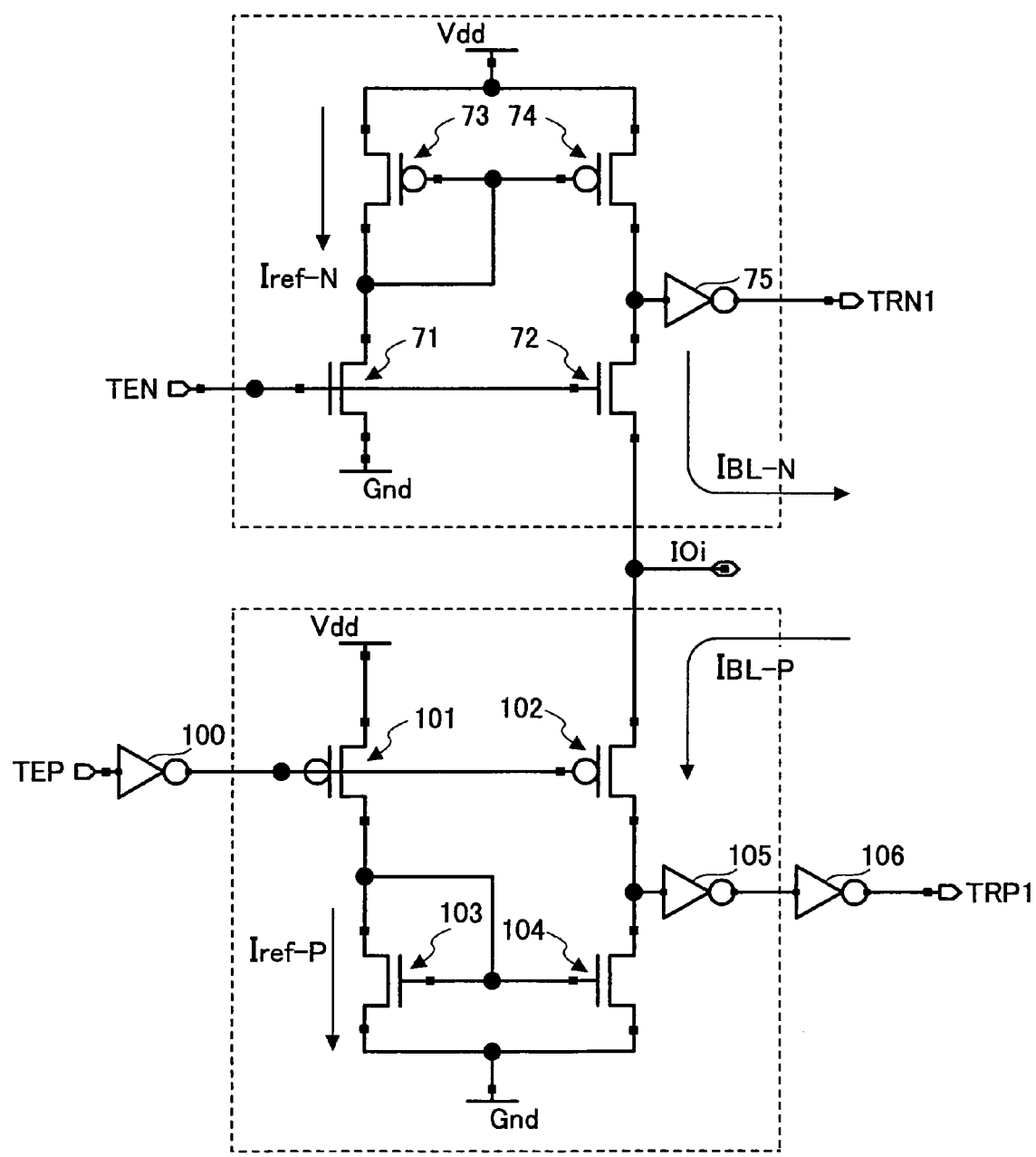
FIG. 13 is a circuit diagram showing an example of the configuration of a current sensing circuit according to a second embodiment.

FIG. 13 is a circuit diagram showing an example of the configuration of a current sensing circuit according to the second embodiment. In this embodiment, each of the current sensing circuits 53 and 54 shown in FIG. 6 may have the same circuit configuration shown in FIG. 13.

The current sensing circuit of FIG. 13 includes the NMOS transistors 71 and 72, the PMOS transistors 73 and 74, the inverter 75, an inverter 100, PMOS transistors 101 and 102, NMOS transistors 103 and 104, and inverters 105 and 106. The same elements as those of FIG. 7 are referred to by the same numerals, and a description thereof may be omitted when unnecessary.

The PMOS transistors 73 and 74 have the same channel width and same channel length, and have the gate nodes thereof coupled to each other, thereby forming a current mirror circuit. A reference current $I_{ref}$-N runs through the PMOS transistor 73 and the NMOS transistor 71, and the current $I_{BL}$-N runs through the PMOS transistor 74 and the NMOS transistor 72. The current $I_{BL}$-N is supplied to the NMOS transistor 21, for example, via the NMOS transistor 29 as shown in FIG. 12.

The NMOS transistors 103 and 104 have the same channel width and same channel length, and have the gate nodes thereof coupled to each other, thereby forming a current mirror circuit. A reference current $I_{ref}$-P runs through the PMOS transistor 103 and the NMOS transistor 101, and the current $I_{BL}$+P runs through the PMOS transistor 104 and the NMOS transistor 102. The current $I_{BL}$-P is supplied from the power supply potential Vdd through the PMOS transistor 33, for example, and the NMOS transistor 29 as shown in FIG. 12.

The NMOS transistors 71 and 72, the PMOS transistors 73 and 74, and the inverter 75 constitute a first mirror amplifier to detect (sense) the current IBL-N, which flows out of the current sensing circuit. The inverter 100, the PMOS transistors 101 and 102, the NMOS transistors 103 and 104, and the inverters 105 and 106 constitute a second mirror amplifier to detect (sense) the current IBL-P, which flows into the current sensing circuit.

The NMOS transistors 71 and 72 have the gate node thereof to which a test enable signal TEN is applied. When the test enable signal TEN is set to HIGH, the NMOS transistors 71 and 72 are turned on to become conductive. The PMOS transistors 101 and 102 have the gate node thereof to which an inverse of a test enable signal TEP is applied. When the test enable signal TEP is set to HIGH, the PMOS transistors 101 and 102 are turned on to become conductive.

The channel width conditions and channel length conditions with respect to the NMOS transistors 71 and 72 are the same as in the first embodiment. The channel width conditions and channel length conditions with respect to the PMOS transistors 101 and 102 are set similarly to the manner the channel width conditions and channel length conditions of the NMOS transistors 71 and 72 are set.

If the current $I_{BL}$-N is larger than the reference current $I_{ref}$-N, the input node of the inverter 75 is set to a low potential, resulting in the output TRN1 of the inverter 75 being HIGH. If the current $I_{BL}$-N is smaller than the reference current $I_{ref}$-N, the input node of the inverter 75 is set to a high potential, resulting in the output TRN1 of the inverter 75 being LOW.

By the same token, if the current $I_{BL}$-P is larger than the reference current $I_{ref}$-P, the input node of the inverter 105 is set to a high potential, resulting in the output TRP1 of the inverter 106 being HIGH. If the current $I_{BL}$-P is smaller than the reference current $I_{ref}$-P, the input node of the inverter 105 is set to a low potential, resulting in the output TRP1 of the inverter 106 being LOW.

In this manner, the current sensing circuit 53 produces the test result signal TRN1 for the NMOS transistor 21, and produces the test result signal TRP1 for the PMOS transistor 33. By the same token, the current sensing circuit 54 produces a test result signal /TRN1 for the NMOS transistor 22, and produces a test result signal /TRP1 for the PMOS transistor 34. That is, the test result signals TRN1, /TRN1, TRP1, and /TRP1 can be obtained for a single memory cell. For n-th memory cell, test result signals TRNn, /TRNn, TRPn, and /TRPn are obtained in the same manner.

Figure 14:
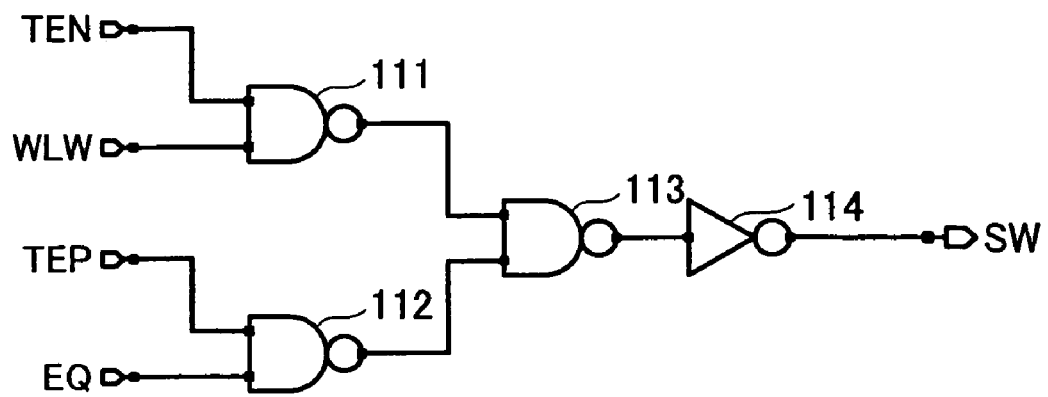
FIG. 14 a circuit diagram showing part of the cell test circuitry of the second embodiment.

FIG. 14 a circuit diagram showing part of the cell test circuitry 56 of the second embodiment. The circuit shown in FIG. 14 includes NAND gates 111 through 113 and an inverter 114. The output SW of the inverter 114 becomes LOW if TEN and WLW are both HIGH or if TEP and EQ are both HIGH. Otherwise, the signal SW is set to HIGH. This signal SW serves as a test selecting signal specifying whether transistors to be tested are tested for their proper conductive state or for their proper nonconductive state.

Figure 15:
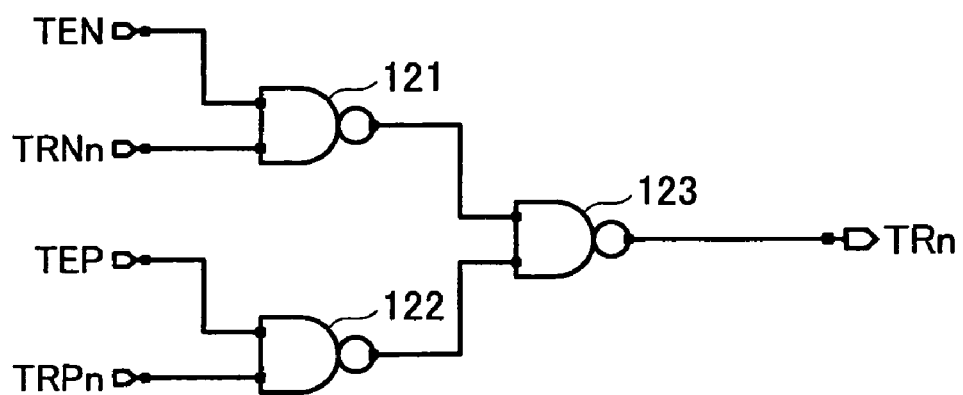
FIG. 15 a circuit diagram showing another part of the cell test circuitry of the second embodiment.

FIG. 15 a circuit diagram showing another part of the cell test circuitry 56 of the second embodiment. The circuit shown in FIG. 15 includes NAND gates 121 through 123. The output TRn of the NAND gate 123 becomes HIGH if TEN and TRNn are both HIGH or if TEP and TRPn are both HIGH. Otherwise, the test result signal TRn is set to LOW. Circuits each having the same configuration as the circuit shown in FIG. 15 is provided for the purpose of producing TR1 through TRn and /TR1 through /TRn, respectively.

The test result signals TR1 through TRn and /TR1 through /TRn produced in this manner are then used in the same manner as in the first embodiment to produce TON and TOFF by use of the circuit shown in FIG. 8. Both TON and TOFF become LOW if all the transistors tested for their operation properly allow respective currents to flow through. Further, both TON and TOFF become HIGH if all the transistors tested for their operation properly prevent respective currents from flowing through.

Figure 16:
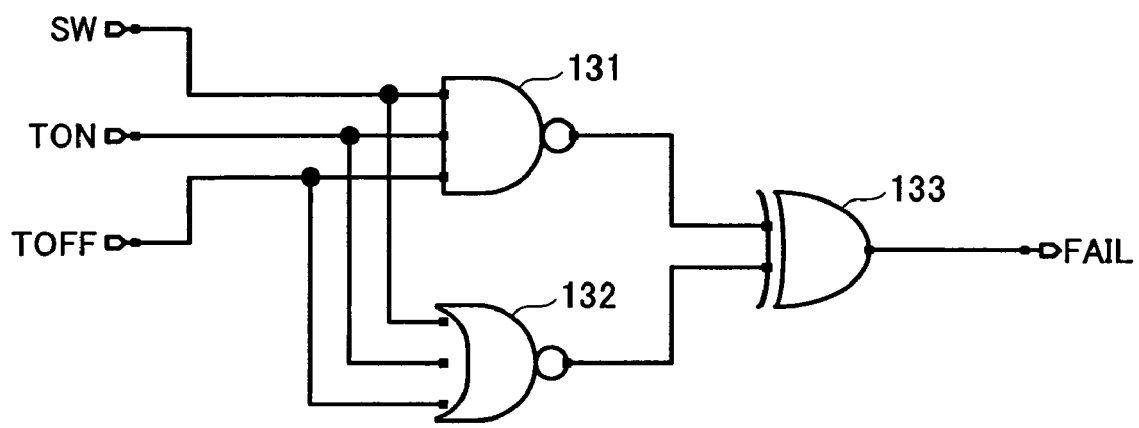
FIG. 16 is a circuit diagram showing another part of the cell test circuitry of the second embodiment.

FIG. 16 is a circuit diagram showing another part of the cell test circuitry 56 of the second embodiment. The part of the cell test circuitry 56 shown in FIG. 16 includes a NAND gate 131, a NAND gate 132, and an exclusive-OR gate 133. When the transistors to be tested are to be tested for their proper conductive state (i.e., currents properly flow through these transistors), the test selecting signal SW is set to HIGH (see FIG. 14).

When the test selecting signal SW is LOW, the output of the NAND gate 131 is fixed to HIGH. Only if both TON and TOFF are set to LOW, indicating that all the tested transistors properly allow respective currents to flow through, does the NOR gate 132 produce a HIGH output, resulting in the output of the exclusive-OR gate 133 being LOW. Otherwise, the output of the exclusive-OR gate 133 is set to HIGH.

When the test selecting signal SW is HIGH, the output of the NOR gate 132 is fixed to LOW. Only if both TON and TOFF are set to HIGH, indicating that all the tested transistors properly prevent respective currents from flowing through, does the NAND gate 132 produce a LOW output, resulting in the output of the exclusive-OR gate 133 being LOW. Otherwise, the output of the exclusive-OR gate 133 is set to HIGH.

Accordingly, the output of the exclusive-OR gate 133 serves as a fail signal FAIL, which becomes LOW if the test results indicate no error, and becomes HIGH if any one of the test results indicates an error.

Figure 17:
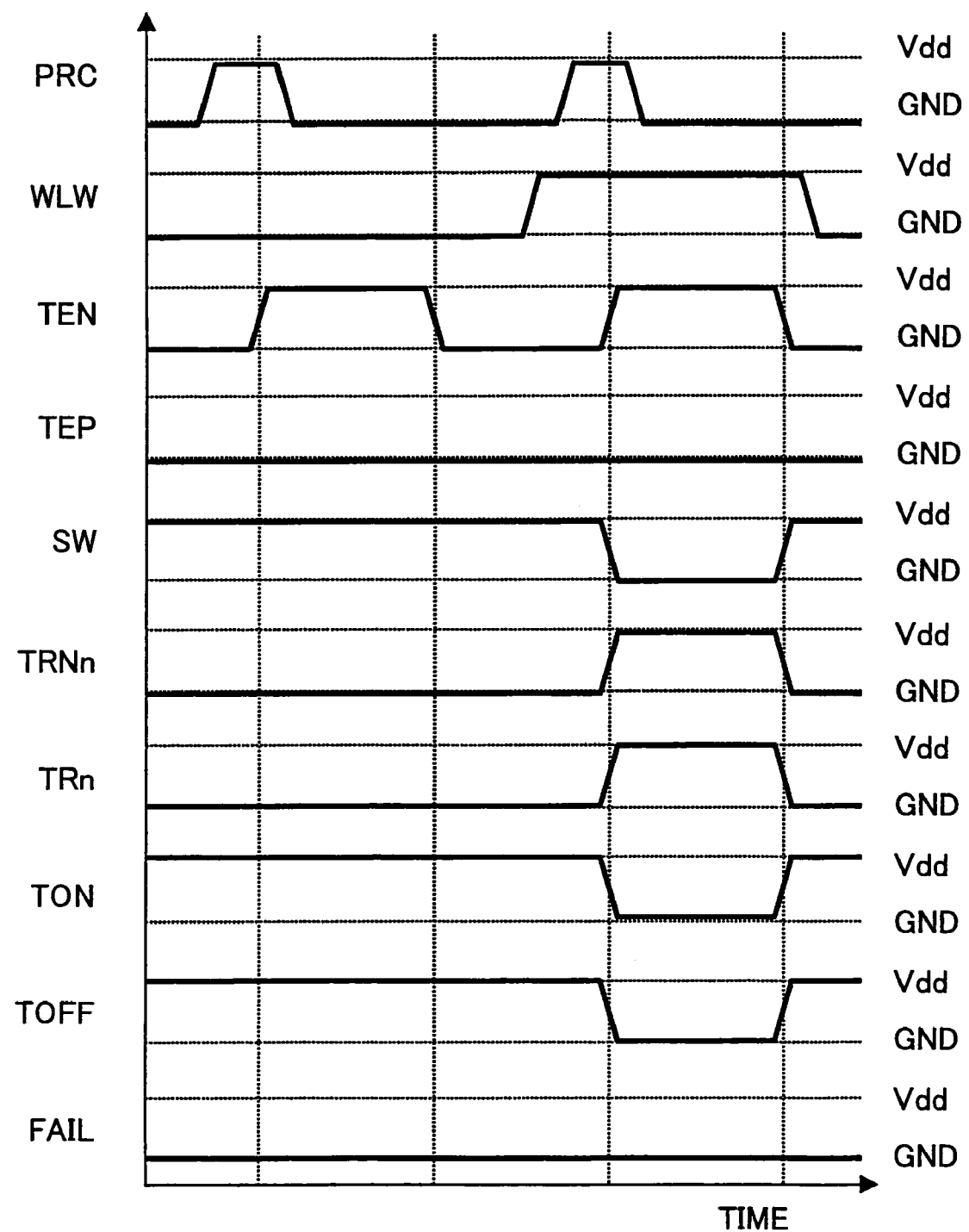
FIG. 17 is a signal waveform chart showing signal waveforms that are used when test operations are performed with respect to NMOS transistors.

FIG. 17 is a signal waveform chart showing signal waveforms that are used when test operations are performed with respect to NMOS transistors (21 and 22 shown in FIG. 12). As shown in FIG. 17, the word selecting line WLW is first set to LOW to check whether all the NMOS transistors to be tested are properly placed in a nonconductive state. The choice of such test is indicated by the HIGH state of the test selecting signal SW. The precharge signal PRC and the test enable signal TEN are then set to HIGH to check the test results, resulting in TON and TOFF being both HIGH. The fact that both TON and TOFF are HIGH in this case indicates that none of the NMOS transistors exhibits an error. The fail signal FAIL is LOW in this case.

The word selecting line WLW is then set to HIGH to check whether all the NMOS transistors to be tested are properly placed in a conductive state. The choice of such test is indicated by the LOW state of the test selecting signal SW. The precharge signal PRC and the test enable signal TEN are then set to HIGH to check the test results, resulting in TON and TOFF being both LOW. The fact that both TON and TOFF are LOW in this case indicates that none of the NMOS transistors exhibits an error. The fail signal FAIL is LOW in this case.

FIG. 18 is a table chart showing logic values of some of the relevant signals for the NMOS test operation. As shown in FIG. 18, when WLW is 0, the fact that TRn (TR1, /TR1, TR2, /TR2, . . . , TRn, and /TRn) are all zero indicates there is no error. If any one of TRn is 1, the fail signal FAIL becomes 1, indicating the presence of an error.

When WLW is 1, on the other hand, the fact that TRn (TR1, /TR1, TR2, /TR2, . . . , TRn, and /TRn) are all "1" indicates there is no error. If any one of TRn is zero, the fail signal FAIL becomes 1, indicating the presence of an error.

Figure 19:
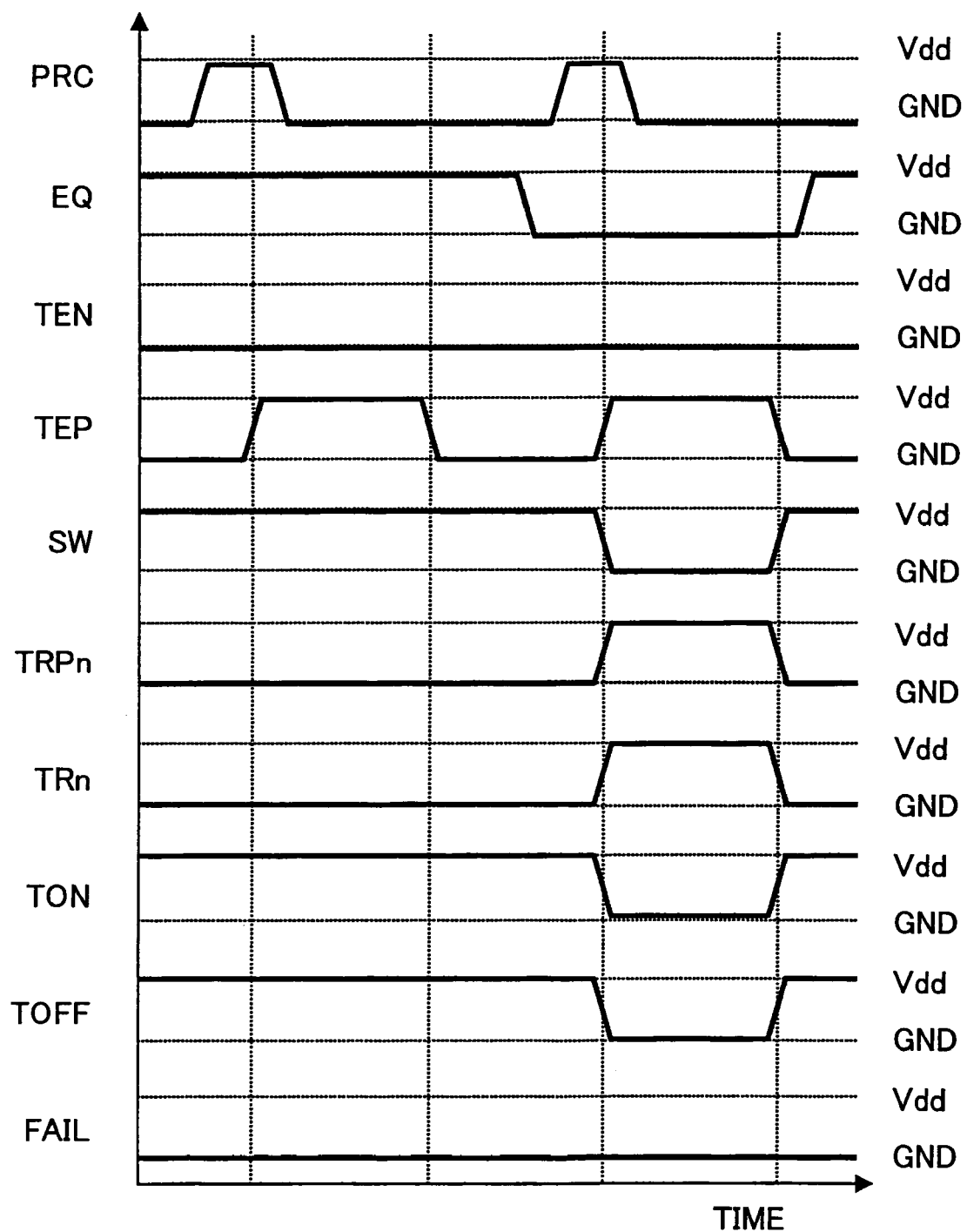
FIG. 19 is a signal waveform chart showing signal waveforms that are used when test operations are performed with respect to PMOS transistors.

FIG. 19 is a signal waveform chart showing signal waveforms that are used when test operations are performed with respect to PMOS transistors (33 and 34 shown in FIG. 12). As shown in FIG. 19, the equalize line EQ is first set to HIGH to check whether all the PMOS transistors to be tested are properly placed in a nonconductive state. The choice of such test is indicated by the HIGH state of the test selecting signal SW. The precharge signal PRC and the test enable signal TEP are then set to HIGH to check the test results, resulting in TON and TOFF being both HIGH. The fact that both TON and TOFF are HIGH in this case indicates that none of the PMOS transistors exhibits an error. The fail signal FAIL is LOW in this case.

The equalize line EQ is then set to LOW to check whether all the PMOS transistors to be tested are properly placed in a conductive state. The choice of such test is indicated by the LOW state of the test selecting signal SW. The precharge signal PRC and the test enable signal TEP are then set to HIGH to check the test results, resulting in TON and TOFF being both LOW. The fact that both TON and TOFF are LOW in this case indicates that none of the PMOS transistors exhibits an error. The fail signal FAIL is LOW in this case.

FIG. 20 is a table chart showing logic values of some of the relevant signals for the PMOS test operation. As shown in FIG. 20, when EQ is 1, the fact that TRn (TR1, /TR1, TR2, /TR2, . . . , TRn, and /TRn) are all zero indicates there is no error. If any one of TRn is 1, the fail signal FAIL becomes 1, indicating the presence of an error.

When EQ is 0, on the other hand, the fact that TRn (TR1, /TR1, TR2, /TR2, . . . , TRn, and /TRn) are all "1" indicates there is no error. If any one of TRn is zero, the fail signal FAIL becomes 1, indicating the presence of an error.

In the embodiments described heretofore, the nonvolatile memory unit is comprised of n-channel silicon MOS transistors. This is a non-limiting example. Other transistors such as p-channel silicon MOS transistors may as well be used to form the nonvolatile memory unit, and the test mechanism of the present invention may as well be properly used.

Further, these embodiments have been described with reference to an example in which a hot-carrier effect is used as a cause of an irreversible change. Other phenomenon such as NBTI (Negative Bias Temperature Instability) or PBTI (Positive Bias Temperature Instability) may be used to cause an irreversible change in place of the hot-carrier effect. Even when such other phenomenon is used for nonvolatile data retention, the test mechanism of the present invention may properly be used.

Further, the present invention is not limited to these embodiments, but various-variations and modifications may be made without departing from the scope of the present invention.

What is claimed is:

1. A nonvolatile semiconductor memory device, comprising:
   bit lines;
   word selecting lines;
   a plurality of memory cells arranged in a matrix, one of said memory cells including a MIS transistor configured to experience an irreversible change in transistor characteristics thereof to store data as the irreversible change, the MIS transistor having a gate node thereof coupled to one of the word selecting lines and a source/drain node thereof coupled to one of the bit lines, and the MIS transistor becoming conductive in response to a first state of said one of the word selecting lines and becoming nonconductive in response to a second state of said one of the word selecting lines; and a test circuit coupled to said one of the bit lines to sense a current running through the MIS transistor, said test circuit configured to indicate error in response to either a detection of presence of said current when said one of the word selecting lines is in the second state or a detection of absence of said current when said one of the word selecting lines is in the first state.

2. The nonvolatile semiconductor memory device as claimed in claim 1, wherein any given one of the memory cells includes a corresponding MIS transistor configured to experience an irreversible change in transistor characteristics thereof to store data as the irreversible change, said corresponding MIS transistor having a gate node thereof coupled to a corresponding one of the word selecting lines and a source/drain node thereof coupled to a corresponding one of the bit lines, and said corresponding MIS transistor becoming conductive in response to the first state of said corresponding one of the word selecting lines and becoming nonconductive in response to the second state of said corresponding one of the word selecting lines, and wherein said test circuit is further coupled to said corresponding one of the bit lines to sense a corresponding current running through said corresponding MIS transistor, said test circuit configured to indicate error in response to either a detection of presence of said corresponding current with respect to any given one of the memory cells when said corresponding one of the word selecting lines is in the second state or a detection of absence of said corresponding current with respect to any given one of the memory cells when said corresponding one of the word selecting lines is in the first state.

3. The nonvolatile semiconductor memory device as claimed in claim 2, further comprising a column selector configured to selectively couple some of the memory cells simultaneously to the test circuit via the respective bit lines, wherein said test circuit is configured to indicate error in response to either a detection of presence of said corresponding current with respect to any given one of said some of the memory cells when said corresponding one of the word selecting lines is in the second state or a detection of absence of said corresponding current with respect to any given one of said some of the memory cells when said corresponding one of the word selecting lines is in the first state.

4. The nonvolatile semiconductor memory device as claimed in claim 1, wherein said one of said memory cells includes:

a latch having a first node and a second node configured to be bi-stable with a potential of the first node inverse to a potential of the second node; and a pair of MIS transistors, one of which is said MIS transistor, said MIS transistors being coupled to the first node and the second node, respectively.

5. The nonvolatile semiconductor memory device as claimed in claim 4, wherein said one of said memory cells includes a potential supply transistor coupled between said first node and a predetermined potential, said test circuit configured to indicate error in response to either a detection of presence of a current running through the potential supply transistor when the potential supply transistor is turned off or a detection of absence of a current running through the potential supply transistor when the potential supply transistor is turned on.

6. The nonvolatile semiconductor memory device as claimed in claim 5, wherein the current running through the MIS transistor and the current running through the potential supply transistor flow in opposite directions on said one of the bit lines, and wherein said test circuit includes:

a first current sensing circuit configured to sense a current flowing in a first direction on said one of the bit lines; and a second current sensing circuit configured to sense a current flowing in a second direction on said one of the bit lines.

7. The nonvolatile semiconductor memory device as claimed in claim 1, further comprising a mode selector configured to specify an operation mode, said test circuit and said word selecting lines being controlled in response to the operation mode specified by said mode selector.

8. A method of testing a nonvolatile semiconductor memory device, which includes bit lines and a plurality of memory cells arranged in a matrix, one of said memory cells including a MIS transistor configured to experience an irreversible change in transistor characteristics thereof to store data as the irreversible change, the MIS transistor having a source/drain node thereof coupled to one of the bit lines, said method comprising the steps of:

placing the MIS transistor in a selected one of a conductive state and a nonconductive state;

checking a current flowing through the one of the bit lines to check a current flowing through the MIS transistor.

* * * * *